US000001245H

United States Statutory Invention Registration [19]

[11] Reg. Number: H1245

Griswold et al.

[43] Published: Oct. 5, 1993

[54] HIGH-G SUPPORT FRAME ASSEMBLY

[75] Inventors: Donald R. Griswold, Scottsdale; Robert J. Lamp, Chandler, both of Ariz.

[73] Assignee: The United States of America as represented by the Secretary of the Army, Washington, D.C.

[21] Appl. No.: 972,048

[22] Filed: Nov. 5, 1992

[51] Int. Cl.[5] ..... H05K 7/02

[52] U.S. Cl. ..... 361/419; 361/380; 439/620; 174/50; 102/206; 102/275.9; 102/501

*Primary Examiner*—Bernarr E. Gregory

*Attorney, Agent, or Firm*—Anthony T. Lane; Edward Goldberg; Michael Sachs

[57] ABSTRACT

The High "g" support frame comprising a skeletal structure having oversized frame component holes therein is attached to a printed wiring board to aid in supporting electronic components in High "g" environments. The size of the frame component holes and the choice of potting compound is customized to the individual components support need.

5 Claims, 3 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

HIGH-G SUPPORT FRAME ASSEMBLY

GOVERNMENTAL INTEREST

The invention described herein may be manufactured, used and licensed by or for the government for Governmental purposes without the payment of any royalty thereon.

BACKGROUND OF THE INVENTION

Printed wiring boards (PWBs) holding electronic components have been used in the past in various equipment. A particular problem arises in the use of such equipment when the equipment is subjected to high vibration and shock environments. In the case of electronic fuzing for military applications such as projectiles and bombs, many varied electronic parts must be made to survive and function in severe environments, frequently as high as 30,000 g's and 30,000 revolutions per minute. In transportation, the increased use of electronics often subjects critical control and monitoring devices to high vibration and shock environments.

Prior art printed wiring boards subjected to high stress loading conditions aforedescribed frequently used thick conformal coatings of a compliant plastic or epoxy material. Another method used in the prior art was solid potting. In solid potting the PWBs are placed within a housing and the entire system is potted into a solid assembly. A further prior art method consisted of controlled potting, wherein a potting mold is placed over a complete PWB and the potting material is applied. After curing of the potting, the mold has to be removed and cleaned for use on the next PWB.

The problem with prior art potted PWBs used in projectile fuzing was that the components when subjected to gravity levels in excess of 30,000 g's simply shear off the PWB due to their own induced weight. Prior art conformal coating of PWBs frequently require quality assurance inspectors to make judgement calls on whether the proper amount of potting has been used, the average thickness of the coating and whether the coating provides the proper fillet and radii sizes for each component and what is the maximum acceptable void. This inspection procedure is expensive and not always reliable.

SUMMARY OF THE INVENTION

The present invention relates to a high "g" support frame in the form of a rigid skeletal structure attached to a printed wiring board. The frame aids in supporting electronic components in high g environments. The support frame is attached to the PWB by either adhesive and/or mechanical means. The frame has slightly oversized pockets therein whose location correspond to the locations of the components on the PWB. After the frame is attached to the PWB the pockets are filled with potting compound to pot the components in place. The selection of the potting compound can be customized to the individual component's support and cushioning needs. Customized support of the components can also be achieved by the sizing of the pockets enclosing the component. An oversized pocket will tend to provide more isolation to a specific component than a smaller pocket will when using the same potting compound. A cover may be placed over the support frame to provide additional support for the components.

An object of the present invention is to provide support and isolation for electronic components experiencing high "g" loads under impact loading conditions such as found in gunfire projectile fuzing conditions.

Another object of the present invention is to provide the handling of printed wiring boards before potting material used on the boards have fully cured.

Another object of the present invention is to allow for the customizing of the potting materials used for each component of a printed wiring board. (PWB)

Another object of the present invention is to provide for a PWB support frame having clearly defined boundary conditions which allows for mathematical modeling of the system and hence easier analysis.

Another object of the present invention is to provide protection to a PWB and the components thereon during general handling and from environmental damage.

Another object of the present invention is to provide a support frame for use with PWBs oriented in the vertical plane as related to the forces to be applied to them.

Another object of the present invention is to provide a support frame to help keep electronic components attached to PWBs under gunfire impact loading conditions.

Another object of the present invention is to provide a support frame having potting material therein which can cushion and reduce shock induced loads on PWB components and also provide a load path to reduce loading on solder joints.

Another object of the present invention is to minimize the amount (volume) of high-"g" printed wiring board assemblies.

A further object of the present invention is to provide a definite form for a PWB/Frame assembly to allow for easier mating of other assemblies to PWB assembly.

For a better understanding of the present invention, together with other and further objects thereof, reference is made to the following description taken in connection with the accompanying drawings.

BRIEF DESCRIPTION OF THE DRAWINGS

Throughout the following description, like reference numerals are used to denote like parts of the drawings.

DETAILED DESCRIPTION OF THE PREFERRED EMBODIMENTS

Figure 2:
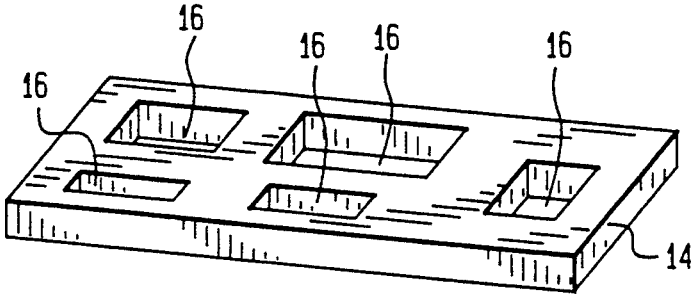
FIG. 2 is an isometric view of a High "g" support frame.
Figure 1:
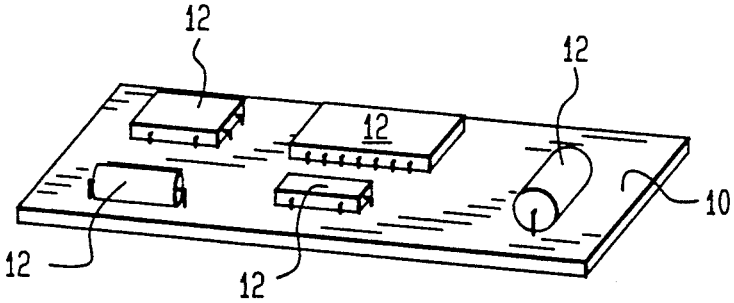
FIG. 1 is an isometric view of a printed wiring board with components thereon.
Figure 3:
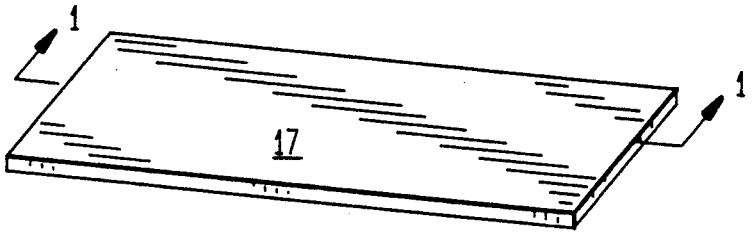
FIG. 3 is a isometric view of a cover plate for the support frame of FIG. 2.
Figure 4:
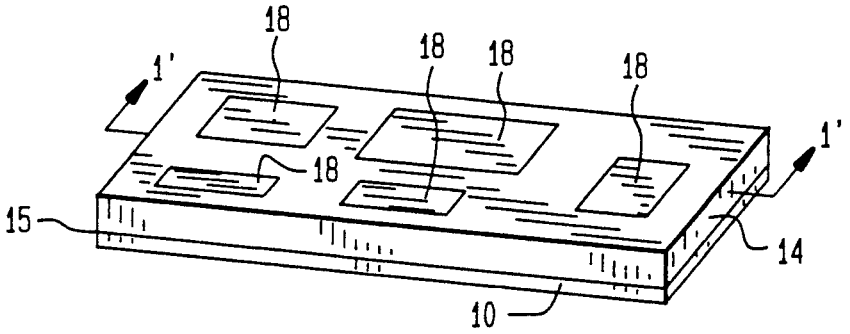
FIG. 4 is an isometric view of a High "g" support frame with a potted printed wiring board attached thereto.
Figure 5:
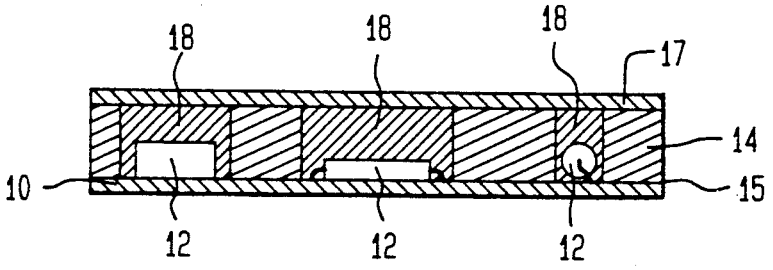
FIG. 5 shows a cross-sectional view of the High "g" support system assembled taken along line 1—1 and 1'-1' of FIGS. 3 and 4 respectively lying in the same plane.

Referring now to FIG. 1 a rectangularly-shaped printed wiring board 10 has a plurality of electronic components 12 soldered thereon. The method of making printed wiring boards is well known in that art and for the sake of brevity will not be discussed herein. FIG. 2 shows a rectangularly shaped support frame 14 which has oversized pockets 16 cutout therein. The frame pockets 16 match the location of the components 12 so that when the support frame 14 is positioned on top of wiring board 10 there is no interference between the wiring board 10 and the frame 14. The frame is made of an insulative material that is capable of supporting structural loads. FIG. 3 shows a rectangularly-shaped flat cover 17. This cover is generally made of the same material as the frame. FIG. 4 shows the support frame 14 assembled and fixed to the printed wiring board 10. An insulation potting compound 18 fills the voids in the pockets 16 between the components 12 and the frame 14. The potting compound is relatively compliant and provides both cushioning and isolation to the component. FIG. 5 shows the cross-sectional assembled and potted High "g" support frame 14 sandwiched between the cover 17 and the printed wiring board 10.

Figure 6:
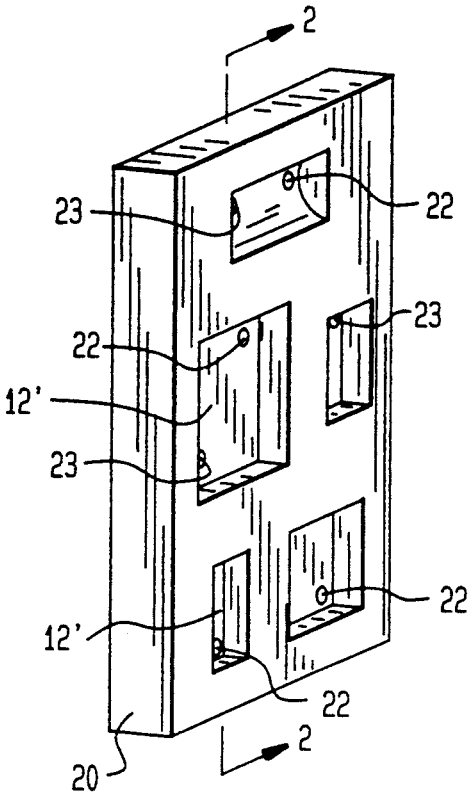
FIG. 6 is an isometric front view of an alternate design High "g" support frame.
Figure 7:
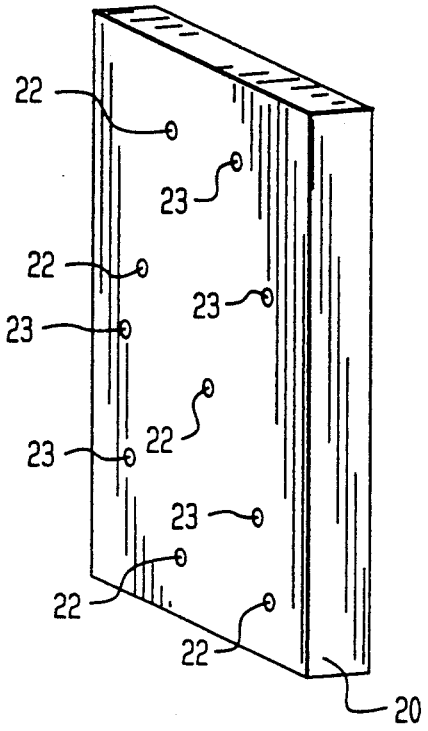
FIG. 7 is a rear view of the alternate design High "g" support frame of FIG. 6.
Figure 8:
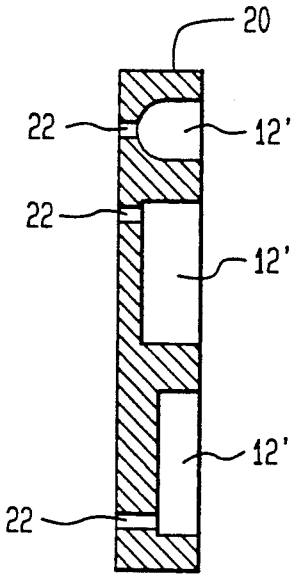
FIG. 8 is a cross-sectional view taken along line 2—2 of FIG. 6.

Referring now to FIGS. 6–8 the alternate design support frame 20 incorporates the cover 17 of FIG. 3 into the modified support frame 20 and includes fill and riser holes 22 and 23 respectively connected to each of frame pockets 12'.

In operation the printed wiring board assembly shown in FIG. 1 is fixedly attached to the support frame 14. The support frame 14 may be attached to the printed wiring board 10 by either an adhesive 15 and/or by mechanical means not shown. The frame pockets 16 have been made oversized and positioned within the support frame 14 to match and clear the components located on the printed wiring board 10. A potting compound 18 is then poured into the pockets, filling them to the top surface of the support frame potting the components in place. A frame cover 17 is then fixedly attached to the support frame 14 thereby completing the assembly as shown in cross-section of FIG. 5. The cover 17 will contain the potting and provide additional support for the components.

In the alternate design the printed wiring board 10 is operatively attached to the open front face of the alternate design support frame 20. Oversized component frame pockets 12' and fill and riser holes 22 and 23 respectively for each pocket 12' were previously made in the frame to match and clear the components located on the printed wiring board 10. A potting compound, not shown in FIGS. 6–8, is then inserted under pressure into the frame pockets 12' through one of the fill holes 22 until the potting material is seen to be extruded from a companion riser hole 23 of that pocket. The filling procedure afore described is continued until all pockets are filled.

Support frame 14 or 20 should be made of a rigid insulative material such as Polyetherimide (PEI) with a 30% glass fill. Other materials such as Polyethersulfone (PES) or polyetheretherketone (PEEK) could be used. An insulative material is preferred to prevent possible electrical shorts when the frame is attached to the printed wiring board. The material selected for the frame should be relatively stiff since it is to serve as a support. The Young's Modulus of the support frame material should approach or exceed that of the Printed Wiring Board.

Frame cover 17 would usually be made of the same material as that selected for the support frame. The frame cover needs to be a rigid material so that it will serve as part of the supporting structure of the support frame system. The function of the frame cover is to confine the potting material and it must be capable of supporting the loads exerted by the potting during environmental loading of the system (in one application of this design the environmental load consisted of a 30,000 G 5 ms half sine wave). Since the cover is not in direct contact with any electronic components or the printed wiring board, conductive material such as steel or aluminum can also be used.

Potting compound 18 should be a castable material that is relatively compliant such as foamed urethane. The potting compound acts as an isolator to the electronic component, cushioning the component from shock inputs. Other materials such as Silicone could be used as a potting material. The properties that are of concern in the selection of the potting material are that the material needs to be an electric insulator; compliant, soft; castable, that is, it can be poured or injected into a cavity and will become solid when allowed to cure.

Selection of the potting material can be tailored to the specific application. Components needing protection from high frequency shock inputs could use a different compound than those needing protection from low frequency inputs.

What is claimed is:

1. A support frame for a printed wiring board having a electronic components exposed to a gunfire environment exceeding accelerations of 30,000 times the force of gravity which comprises:

a skeletal frame having component pockets located therein which correspond to the locations of said electronic components disposed on said printed wiring board;

means for operatively attaching said printed wiring board to said skeletal frame;

potting means for filling said component pockets and for providing customized component support need; and cover means for containing said potting means and providing additional support for said components.

2. A support frame as recited in claim 1 wherein said means for attaching said printed wiring board to said skeletal frame includes an adhesive material.

3. A support frame as recited in claim 2 wherein said potting means includes cushioning means for reducing shock induced loads on said components by said gunfire environment.

4. A support frame as recited in claim 3 wherein said cover means includes a flat plate member attached to said skeletal frame after said component pockets are filled with said potting means.

5. A support frame as recited in claim 4 wherein said support frame includes component pockets having separate fill and riser holes for each pocket.

* * * * *